United States Patent
Oden et al.

(10) Patent No.: US 9,448,484 B2
(45) Date of Patent: Sep. 20, 2016

(54) SLOPED ELECTRODE ELEMENT FOR A TORSIONAL SPATIAL LIGHT MODULATOR

(71) Applicant: Texas Instruments Incorporated, Dallas, TX (US)

(72) Inventors: Patrick I. Oden, McKinney, TX (US); James C. Baker, Coppell, TX (US); Sandra Zheng, Allen, TX (US); William C. McDonald, Allen, TX (US); Lance W. Barron, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/531,877

(22) Filed: Nov. 3, 2014

(65) Prior Publication Data

US 2016/0124311 A1    May 5, 2016

(51) Int. Cl.
G03F 7/20     (2006.01)
G02B 26/08    (2006.01)
G03F 7/36     (2006.01)
G03F 7/16     (2006.01)

(52) U.S. Cl.
CPC ............ *G03F 7/36* (2013.01); *G02B 26/0841* (2013.01); *G03F 7/16* (2013.01); *G03F 7/20* (2013.01)

(58) Field of Classification Search
CPC .............. G03F 7/36; G03F 7/16; G03F 7/20; G02B 26/0841
USPC .................................. 430/315, 319, 321, 396
See application file for complete search history.

(56) References Cited

U.S. PATENT DOCUMENTS

| | | | |
|---|---|---|---|
| 6,552,840 B2 | 4/2003 | Knipe | |
| 7,365,898 B2 | 4/2008 | Gong et al. | |
| 7,466,476 B2 | 12/2008 | Mangrum | |
| 7,764,418 B2 | 7/2010 | Mangrum | |
| 2002/0071171 A1* | 6/2002 | Greywall | G02B 26/0841 359/292 |
| 2014/0192397 A1* | 7/2014 | Atnip | B81C 1/00642 359/291 |

OTHER PUBLICATIONS

K. Reimer et al., "16 K Infrared Micromirror Arrays with Large Beam Deflection and Tenth Millimeter Pexel Size", Fraunhofer Institute Silicon Technonogy (ISIT),9 pgs, (Sep. 1999).
K. Reimer, et al., "One-Level gray-tone lithography—mask data preparation and pattern transfer", Fraunhofer Institute Silicon Technonogy (ISIT) SPIE vol. 2783/71,9 pgs, (Mar. 1996).
Gregory T.A. Kovacs, "Micromachined Transducers Sourcebook," 1988, WCB/McGraw-Hill, p. 472.
B. Wagner et al., "Infrared Micromirror Array with Large Pixel Size and Large Deflection Angle," Jun. 16-19, 1997 International Conference on Solid-State Sensors and Actuators, pp. 75-78.

* cited by examiner

*Primary Examiner* — John A McPherson
(74) *Attorney, Agent, or Firm* — Michael A. Davis, Jr.; Frank D. Cimino

(57) ABSTRACT

A method of forming a micro-electromechanical systems (MEMS) pixel, such as a DMD-type pixel, by depositing a photoresist spacer layer upon a substrate. The photoresist spacer layer is exposed to a grey-scale lithographic mask to shape an upper surface of the photoresist spacer layer. A control member is formed upon the shaped spacer layer, and has a sloped portion configured to maximize energy density. An image member is configured to be positioned as a function of the control member to form a spatial light modulator (SLM).

18 Claims, 15 Drawing Sheets

SLOPED ELECTRODE ELEMENT FOR A TORSIONAL SPATIAL LIGHT MODULATOR

TECHNICAL FIELD

This disclosure relates generally to semiconductor microelectromechanical systems (MEMS) technology, and more particularly to spatial light modulators (SLMs).

BACKGROUND

Semiconductor spatial light modulators (SLMs) are suitable for digital imaging applications, including projectors, televisions, printers, and other technology. A DIGITAL MICROMIRROR DEVICE (DMD) is a type of SLM invented in 1987 at TEXAS INSTRUMENTS INCORPORATED of Dallas, Tex. The DMD is a monolithic semiconductor device based on micro-electromechanical systems (MEMS) technology. The DMD generally comprises an area array of bi-stable movable micromirrors forming picture elements (pixels) fabricated over an area array of corresponding addressing memory cells and associated addressing electrodes disposed under the micromirrors. The addressing electrodes are selectively energized by a control circuit with a voltage potential to create an electrostatic attraction force causing the respective micromirrors to tilt towards the respective address electrode. In some applications, the micromirror may be provided with a voltage potential as well. One embodiment of a DMD is disclosed in U.S. Pat. No. 7,011,015 assigned to the same assignee of the present disclosure, the teachings of which are incorporated herein by reference.

The fabrication of the above-described DMD superstructure typically uses a CMOS-like process with a completed SRAM memory circuit. Through the use of multiple photomask layers, the superstructure is formed with alternating layers of aluminum for the address electrodes, hinges, spring tips, mirror layers, and hardened photoresist for sacrificial layers that form air gaps.

The monolithic nature of the design and build of the DMD pixel technology is associated with quasi-planar structures interacting electrostatically with the tilting micromirrors. This presents a problem with the ability to shrink structures while attempting to maintain electrostatic entitlement. In the end, the design becomes more and more sensitive to electrostatic torque delivery originating from the edges of planar members and all the variations that this can create.

The electrostatic efficiency of a torsional spatial light modulator is limited by an elevated address electrode that is parallel to the micromirror when the micromirror is horizontal and not tilted, but which address electrode is angled with respect to the micromirror when tilted toward the address electrode. Providing a higher bias operation to increase torque generation on each address side of the micromirror can provide complications, such as field gradient induced migration of species in the headspace which ultimately can cause failure of the SLM. It can also create shorting where rounded features of raised binge together with a high field (and field gradient) can result in either catastrophic or transient current which can sputter metal from the binge or completely open up the base of the vias. The CMOS node capabilities to deliver additional bias are also problematic as the paths are shrunk.

SUMMARY

This disclosure provides a sloped electrode for a torsional spatial light modulator.

In a first example embodiment, a method comprises depositing a photoresist spacer layer upon an upper surface of a substrate, and exposing the spacer layer to a grey-scale lithographic mask to shape an upper surface of the spacer layer. A control member is formed upon the shaped upper surface such that the control member is non-parallel to the substrate. A positionable image member is formed over the control member, where the image member is configured to be positioned as a function of the control member to form a spatial light modulator (SLM).

In some embodiments, the upper surface of the spacer layer is sloped with respect to the substrate by the grey-scale lithographic mask by masking a selected portion of the spacer layer. The control member comprises an address electrode having a sloped portion. The image member is substantially parallel to the control electrode when tilted over and towards the control electrode to establish a substantially uniform energy density. The substrate includes memory configured to control a position of the image member, and the image member has a light reflective upper surface configured to modulate incident light and form an image. The image member is formed on a torsion hinge, and the control member is elevated above the substrate and positioned below the image member.

In another example embodiment, a method comprises depositing a spacer layer upon an upper surface of a substrate, and forming an address electrode using a grey-scale lithographic mask to shape an upper surface of the spacer layer. A positionable image member over the substrate is configured to be positioned as a function of the address electrode to form a spatial light modulator (SLM).

In some embodiments, the address electrode is formed to be elevated above the substrate and positioned below the image member, wherein the address electrode is sloped with respect to the substrate. The image member is substantially parallel to the address electrode when tilted. The substrate includes memory configured to control a position of the image member, wherein the image member has a light reflective upper surface configured to modulate incident light and form an image, and the image member is formed on a torsion hinge.

In another example embodiment, a method comprises depositing a photoresist spacer layer upon an upper surface of a substrate including memory, and exposing the spacer layer to a grey-scale lithographic mask to shape an upper surface of the spacer layer. A control member is formed upon the shaped upper surface, and a positionable image member is formed over the control member. The image member is substantially parallel to the control member when tilted as a function of the memory to form a spatial light modulator (SLM).

In some embodiments, the image member has a light reflective upper surface configured to modulate incident light and form an image, and the image member is formed on a torsion hinge. Other technical features may be readily apparent to one skilled in the art from the following figures, descriptions, and claims.

BRIEF DESCRIPTION OF THE DRAWINGS

For a more complete understanding of this disclosure and its advantages, reference is now made to the following description, taken in conjunction with the accompanying drawings, in which.

DETAILED DESCRIPTION

FIGS. 1 through 35, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1:
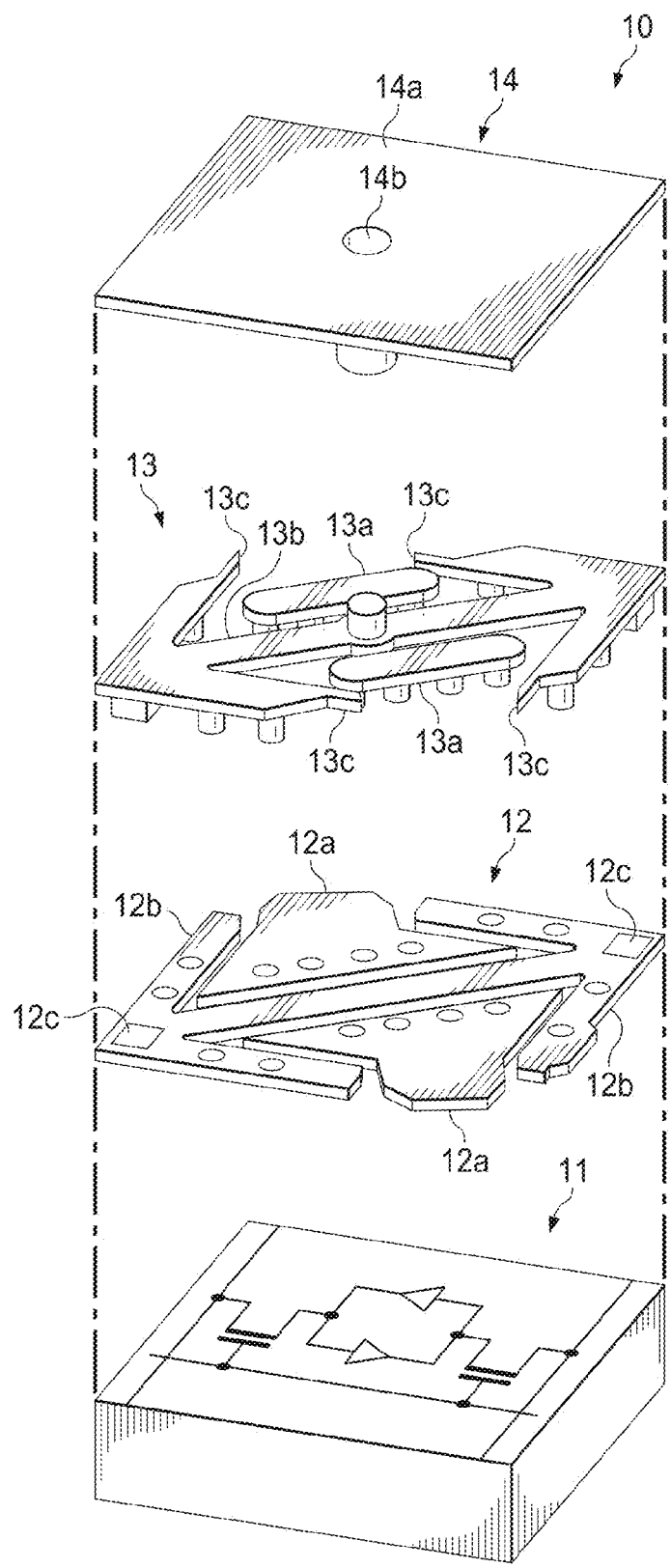
FIG. 1 illustrates an exploded view of a MEMS pixel element in accordance with this disclosure.

FIG. 1 is an exploded view of a pixel element 10, shown in this example embodiment as a DMD pixel. Pixel element 10 is one of an array of such pixel elements fabricated on a wafer (substrate), using semiconductor fabrication techniques. Pixel element 10 is a monolithically integrated MEMS superstructure cell fabricated over a SRAM memory cell 11 formed on the wafer. Two sacrificial photoresist layers have been removed by plasma etching to produce air gaps between three metal layers of the superstructure. For purposes of this description, the three metal layers are "spaced" apart by being separated by these air gaps.

The uppermost first metal (M3) layer 14 has a reflective mirror 14a. The air gap under the mirror 14a frees the mirror 14a to rotate about a compliant torsion hinge 13b, which is part of the second metal (M2) layer 13. The mirror 14a is supported on the torsion hinge 13b by a via 14b. Elevated address electrodes 13a also form part of the M2 layer 13 and are positioned under mirror 14a. A third metal (M1) layer 12 has address electrodes 12a for the mirror 14a formed on the wafer, the address electrodes 12a and 13a each being connected to and driven with a voltage potential by memory cell 11. The M1 layer 12 further has a bias bus 12b which electrically interconnects the mirrors 14a of all pixels 10 to bond pads 12c at the chip perimeter. An off-chip driver (not shown) supplies the bias waveform necessary to bond pads 12c for proper digital operation.

The mirrors 14a may each be 7.4 µm square and made of aluminum for maximum reflectivity. They are arrayed on 8 µm centers to form a matrix having a high fill factor (~90%). Other dimensions of the mirrors 14a may be provided depending on the application. The high fill factor produces high efficiency for light use at the pixel level and a seamless (pixelation-free) projected image. The hinge layer 13 under the mirrors 14a permits a close spacing of the mirrors 14a. Because of the underlying placement of the hinges 13b, an array of pixel elements 10 is referred to as a "hidden hinge" type DMD architecture.

In operation, electrostatic fields are developed between the mirror 14a and its address electrodes 12a and 13a, creating an electrostatic torque. This torque works against the restoring torque of the hinge 13b to produce mirror rotation in a positive or negative direction. The mirror 14a rotates until it comes to rest (or lands) against spring tips 13c, which are part of the hinge layer 13. These spring tips 13c are attached to the underlying address layer 12, and thus provide a stationary but flexible landing surface for the mirror 14a.

Figure 2A:
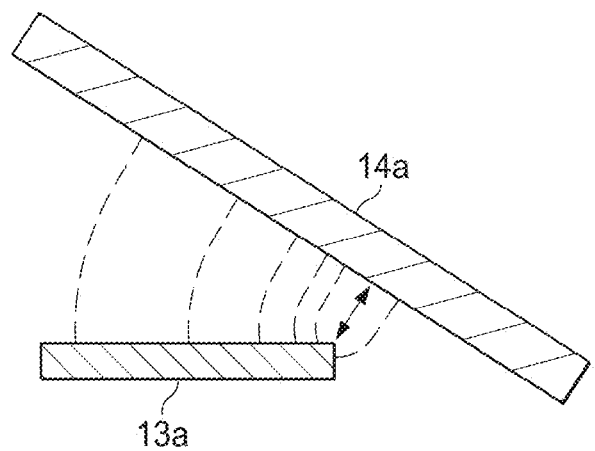
FIG. 2A, FIG. 2B and FIG. 2C illustrate three primary considerations with a tilted MEMS pixel.
Figure 2B:
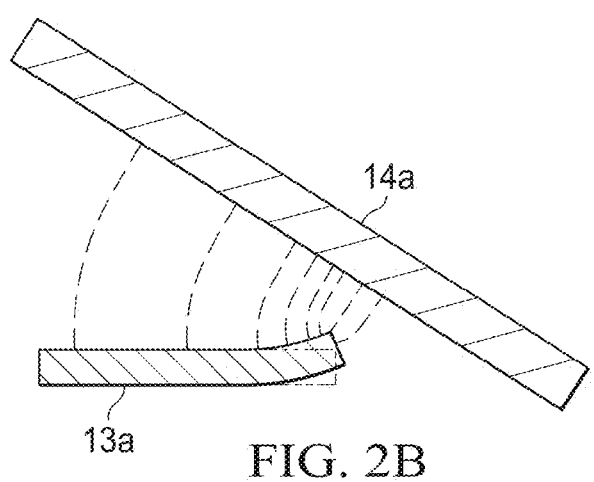
Figure 2C:
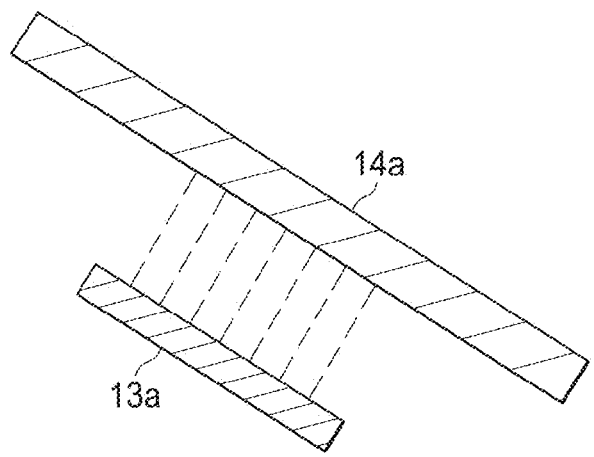

FIG. 2A, FIG. 2B and FIG. 2C illustrate three primary considerations with a tilted MEMS pixel 10 and the electrostatic considerations present. FIG. 2A shows a theoretical electrostatic distribution between the elevated address electrode 13a and the mirror 14a. As shown in FIG. 2B, upward curl is a commonplace condition with the quasi-planar elevated address electrodes 13a which gives additional edge sensitivities. Ideally, it is desired to have a uniform total distribution of the electrostatic field (and force/torque) across the elevated address electrode 13a as shown in FIG. 2C.

Adding to the differential stress of M2 layer, additional curl results in address electrodes 13a and spring tips 13c due to topography coupling in layer 12 through the first sacrificial photoresist spacer layer 15 (FIG. 4), referred to as "binge". Chemical mechanical planarization (CMP) cannot be acted on the binge in the photoresist. Furthermore, because of the gaps between electrodes 12a, the photoresist will fill partially. This non-uniformity is what creates the topography variations.

Figure 3:
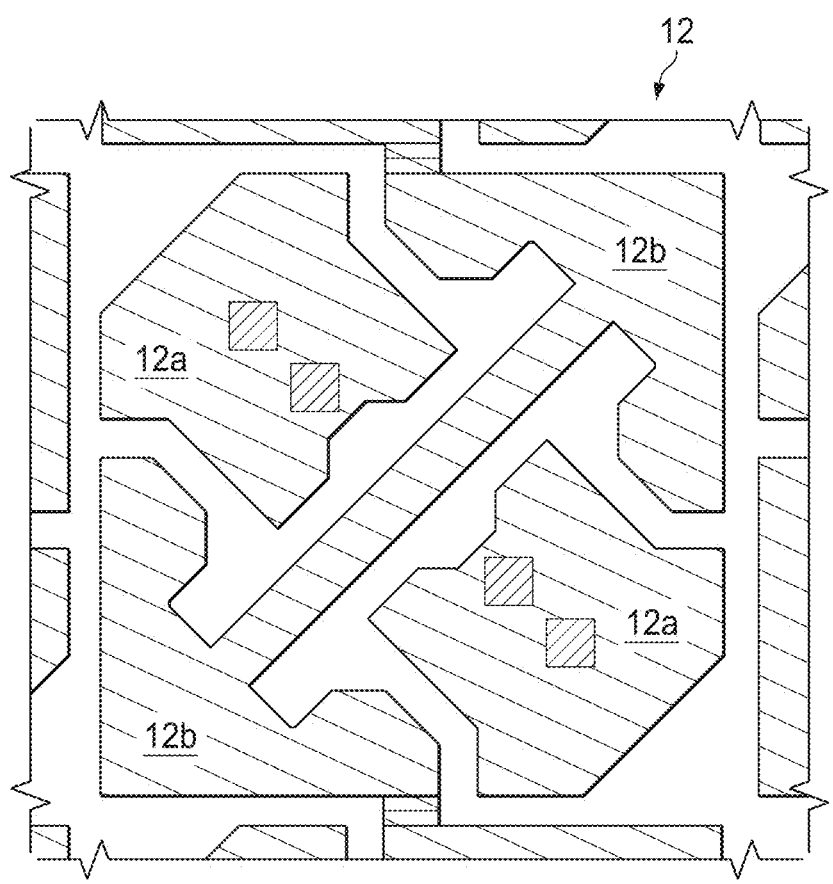
FIG. 3 illustrates an example embodiment of the M1 layer including the address electrode and the bias bus formed on the memory cell.
Figure 4:
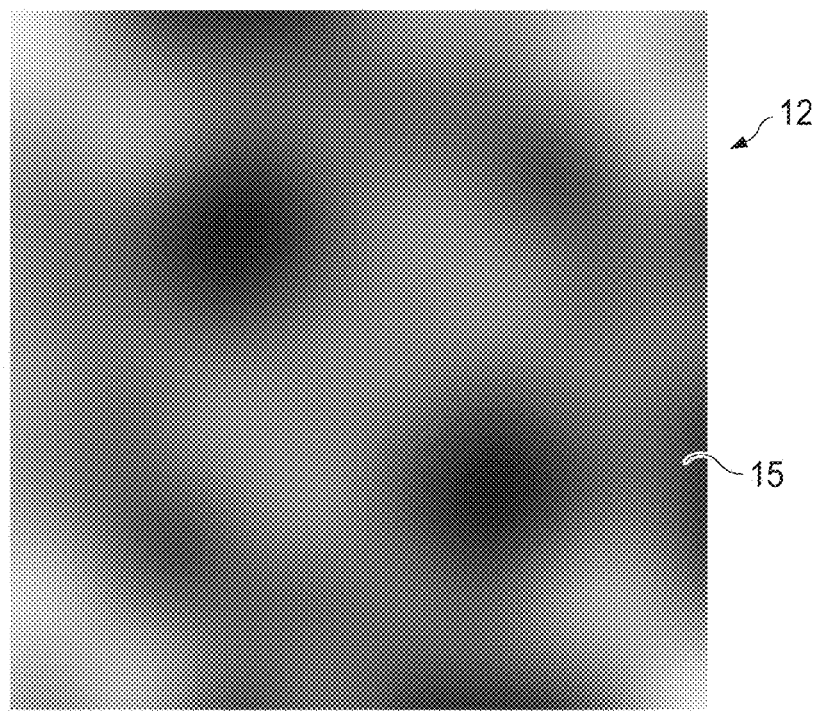
FIG. 4 illustrates an image of the top of the first sacrificial photoresist spacer layer when processed over the M1 layer.

FIG. 3 shows an example embodiment of the M1 layer 12 including the address electrode 12a and the bias bus 12b formed on the memory cell 11. FIG. 4 is an image of the top of the first sacrificial photoresist spacer layer 15 when processed over M1 layer 12. The high features, shown in black in this grey-scale image, show a mounding feature in spacer layer 15 forming the binge over the address electrode 12a.

Figure 5:
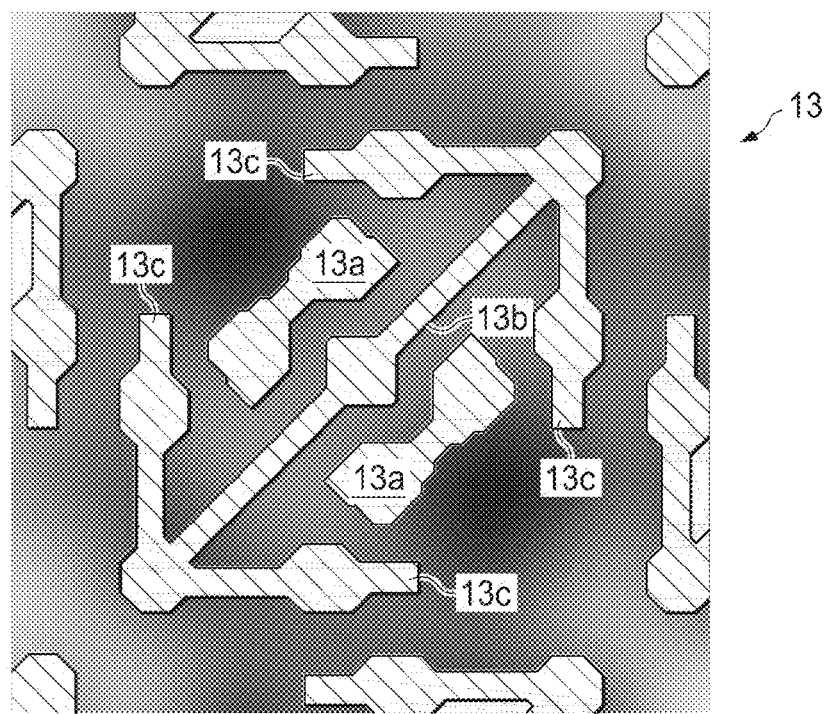
FIG. 5 illustrates the M2 layer including the elevated address electrodes, hinge and spring tips superimposed on top of the photoresist topography shown in FIG. 4.

FIG. 5 shows the M2 layer 13 including the elevated address electrodes 13a, hinge 13b and spring tips 13c superimposed on top of the photoresist topography shown in FIG. 4, with the notable binge at the outer edge of the elevated address electrodes 13a (with respect to the hinge 13b). The binge over the address electrodes 12a consequently causes a variation in the associated elevated address electrodes 13a and spring tips 13c which are processed over the binge, also referred to as curling.

Figure 6:
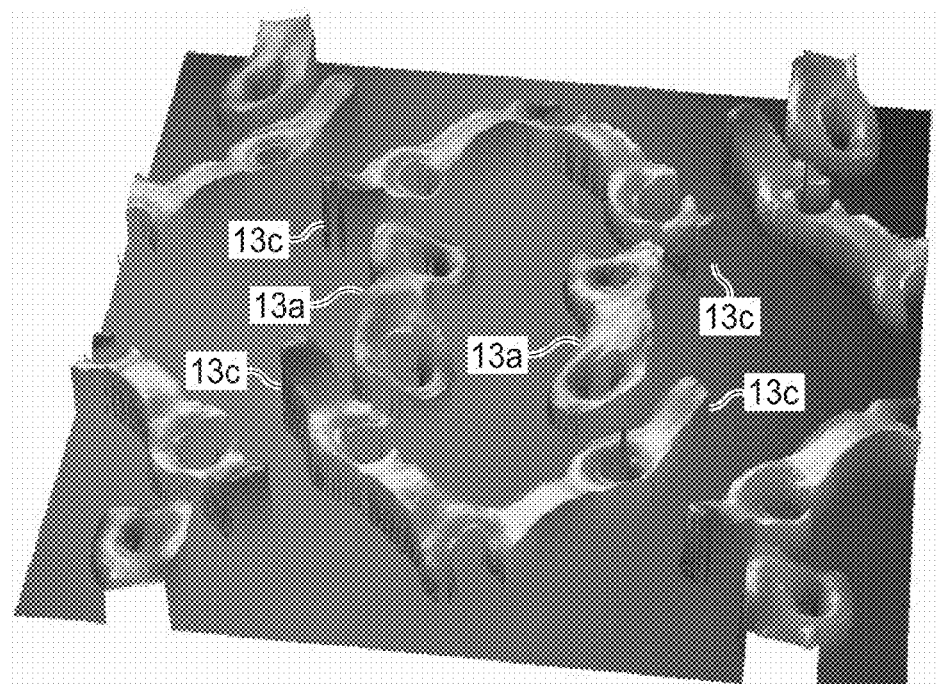
FIG. 6 shows a high-resolution, optical interferometer capture of a 7.6 µm DMD pixel specifically looking at the M2 level, showing a significant amount of curling in the elevated address electrodes and the spring tips.
Figure 7:
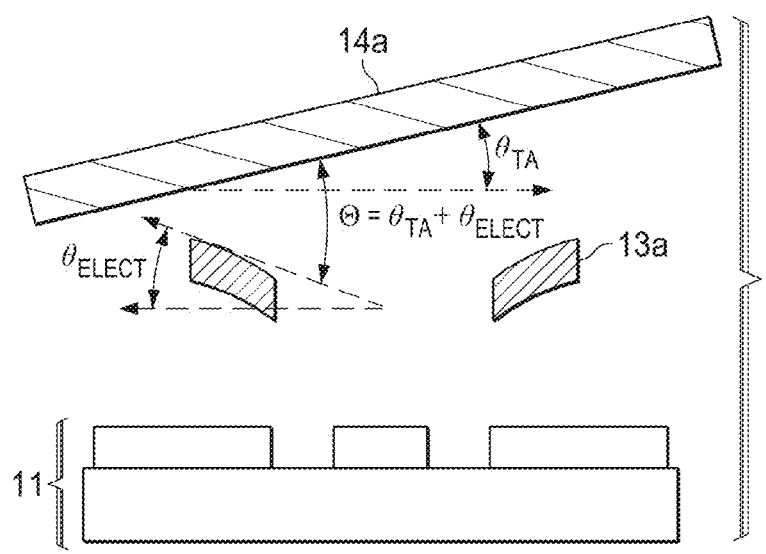
FIG. 7 illustrates curling in the elevated address electrode reducing the combined angle between the mirror and the elevated address electrodes.

FIG. 6 shows a high-resolution, optical interferometer capture of a 7.6 μm DMD pixel specifically looking at the M2 level 13. There is a significant amount of curling in the elevated address electrodes 13a and the spring tips 13c, each which may curl about 2.5 degrees. Scale in this image is exaggerated to show the degree to which the elevated address electrodes 13a and as well as the spring tips 13c are canted in the opposite direction and act to degrade the electrostatic efficiency of the elevated address electrodes 13a. The curling diminishes the gap between the mirror 14a and the adjacent elevated address electrodes 13a during dynamic operation. This is a common location for marginality of the pixel 10 design and is directly correlated to bias destruct and operational space margin. This curling reduces the combined angle between the mirror 14a and the elevated address electrodes 13a to about 14.5 degrees, as shown in FIG. 7. This undesirably gives significant sensitivity to the specific shapes of these address electrode edges to the electrostatic torque delivery and thereby operation and margin of the pixel.

According to this disclosure, the address electrodes 12a and 13a are combined to form a single address electrode that is both sloped and elevated such that the mirror 14a is positioned substantially parallel to the combined address electrode when tilted. A sub-wavelength grey-scale lithography masking process is used to form the shaped address electrode. Advantageously, the surface area of the sloped and elevated address electrode provides electrostatic gains and maximizes energy density in the tilted (latched) state. By sloping the outer portion of the address electrode, the sloped surface can be laterally extended partially or entirely the geometrical length of the mirror 14a without causing collisions because of the additional gap margin obtained by a degree of parallelism between the mirror 14a and the raised and sloped address electrode.

Figure 8:
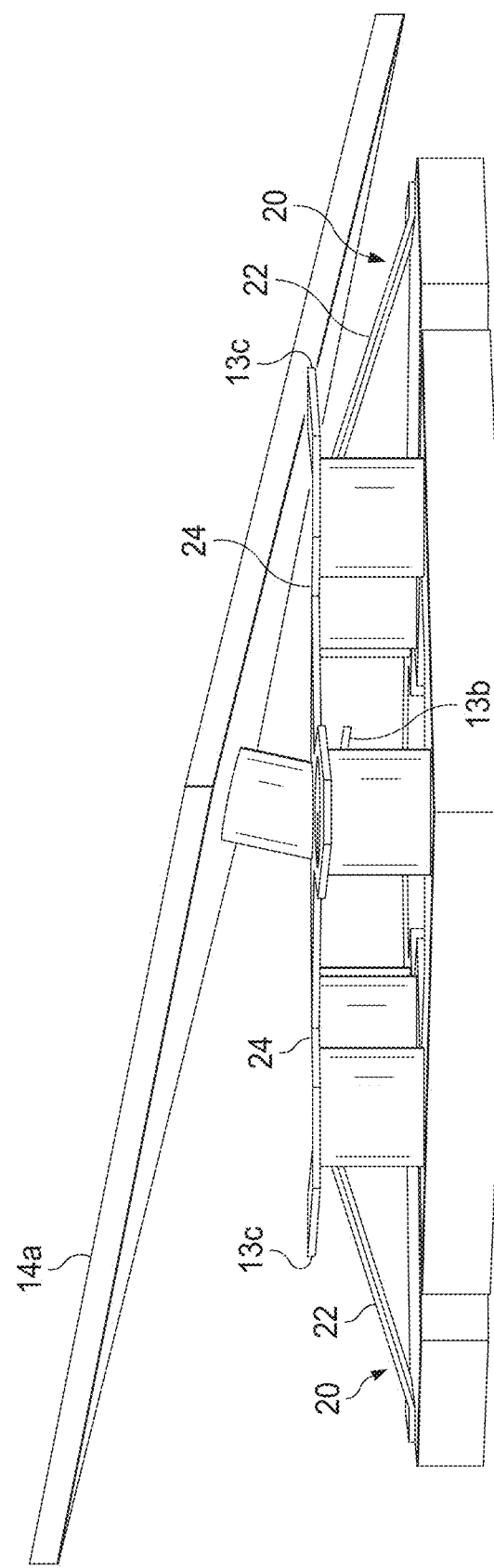
FIG. 8 illustrates a pair of sloped and elevated address electrodes according to this disclosure.

FIG. 8 illustrates one example embodiment of a pair of sloped and elevated address electrodes 20 having an upper surface comprising an outer sloped portion 22 and an inner horizontal portion 24 each facing the mirror 14a above. In an alternative example embodiment, the entire address electrode 20 can be sloped and the horizontal portion 24 is omitted. The horizontal portion 24 is positioned close to the torsion hinge 13b, and the sloped portion 22 angles downwardly away from the horizontal portion 24. In one example embodiment, the sloped portion 22 is angled at 16 degrees with respect to horizontal, and the tilted mirror 14a is angled 12 degrees with respect to horizontal when it lands on the spring tips 13c. Of course, other angles may be suitable in other embodiments.

The sloped portion 22 of address electrode 20 is substantially parallel with the mirror 14a in the tilted state, which maximizes electrostatic energy density while maintaining margin, and which helps to ensure that electrostatic energy is uniformly distributed. In other embodiments, different angles of the sloped portion 22 and the mirror 14a tilt can be selected to establish the angle between the tilted mirror 14a and the sloped electrode portion 22. In one embodiment, the angle of each can be the same such that the mirror 14a and the sloped portion 22 are parallel to each other.

Figure 9:
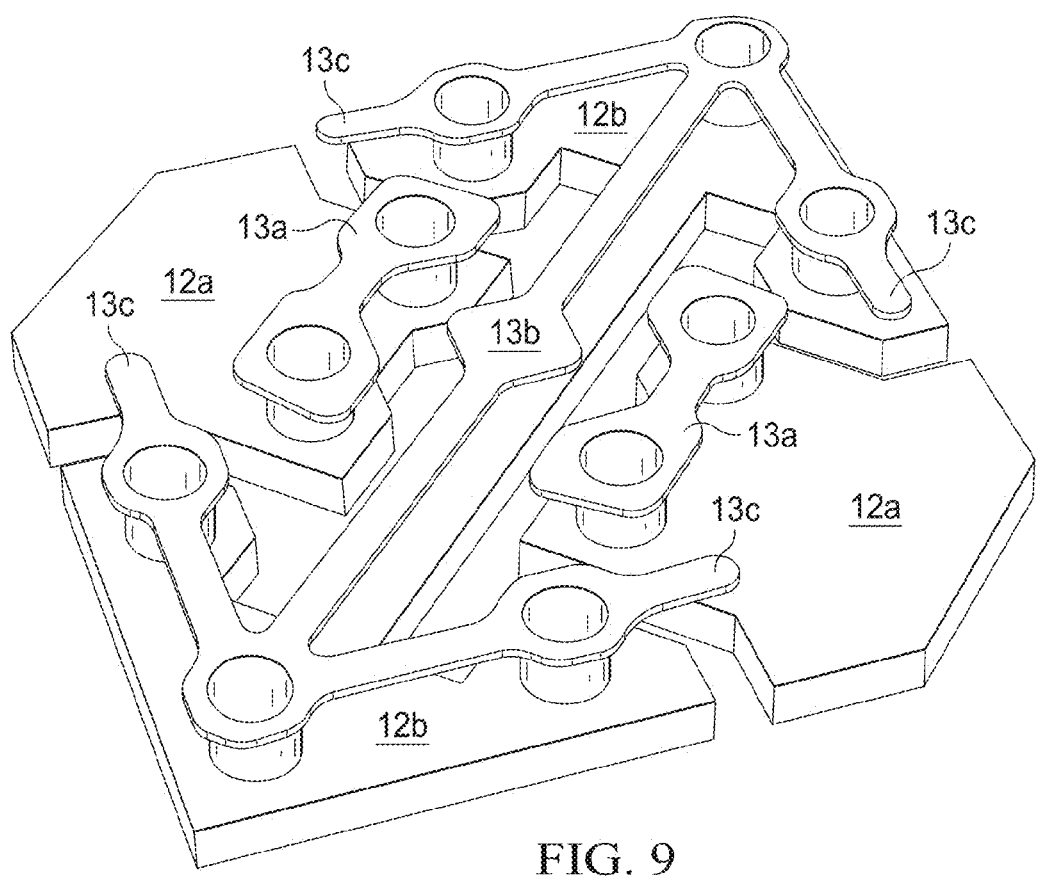
FIG. 9 illustrates a top perspective view of the address electrodes for the pixel shown in FIG. 1.
Figure 10:
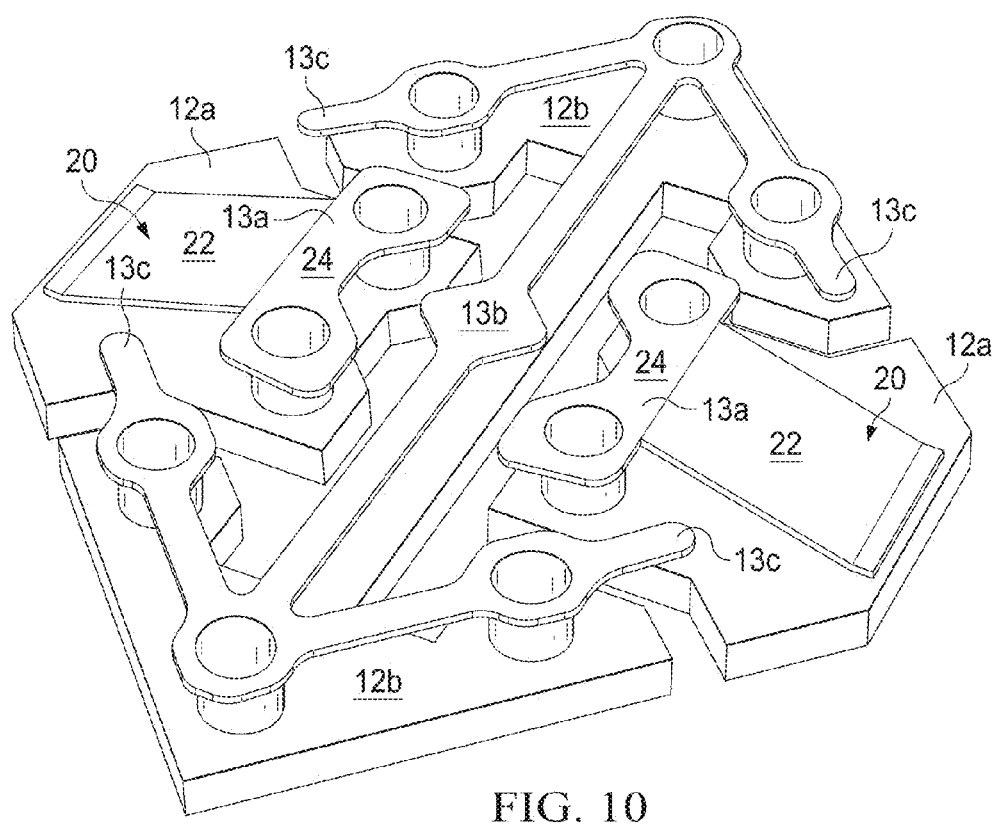
FIG. 10 illustrates a top perspective view of the sloped elevated address electrodes according to this disclosure.

FIG. 9 illustrates a top perspective view of the address electrodes 12a and 13a for the pixel 10 shown in FIG. 1. FIG. 10 illustrates a top perspective view of the address electrodes 20 according to this disclosure. The opposing inner edges of the address electrodes 20 have a notch or recess 26 to provide clearance for the torsion hinge 13b (not shown).

Figure 11:
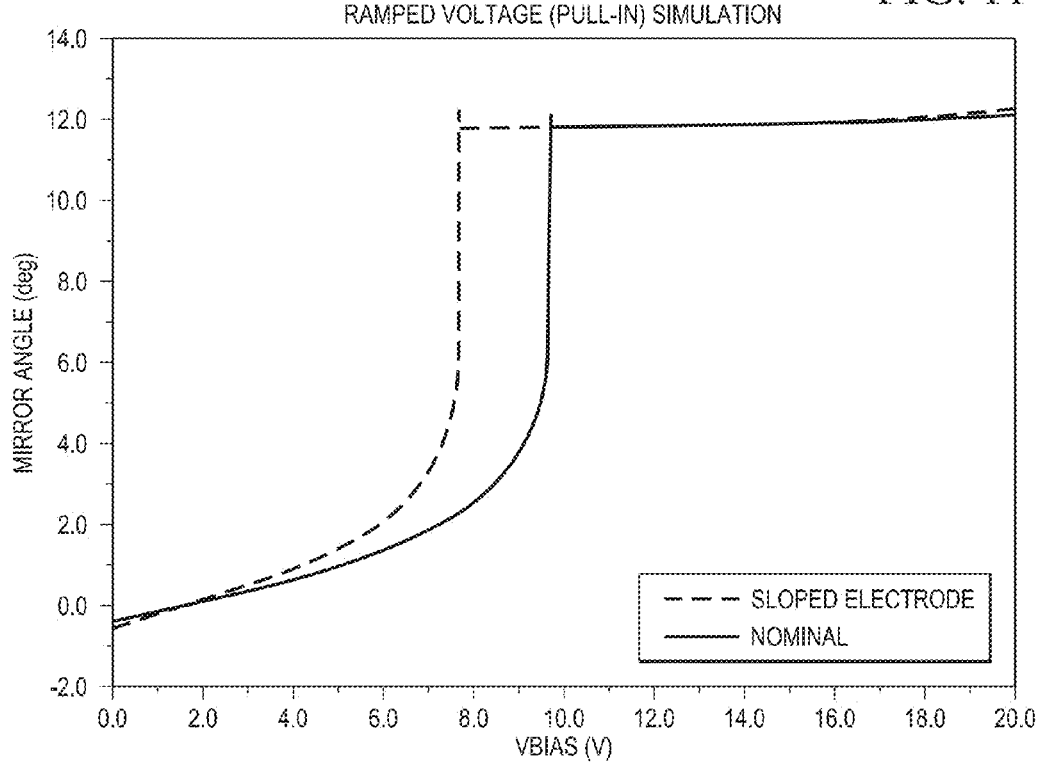
FIG. 11 illustrates a graph of the mirror angle as a function of the voltage applied to the address electrodes.

FIG. 11 illustrates a graph of the angle of the mirror 14a as a function of the voltage applied to the address electrodes for the address electrode configurations shown in FIG. 9 and FIG. 10. The address voltage is ramped up from zero, and it can be seen that elevated sloped electrode 20 has a pull-in threshold of about 7.5 volts, about 2 volts lower than the 9.5 volt pull-in voltage for the combination of address electrodes 12a and 13a.

Figure 12:
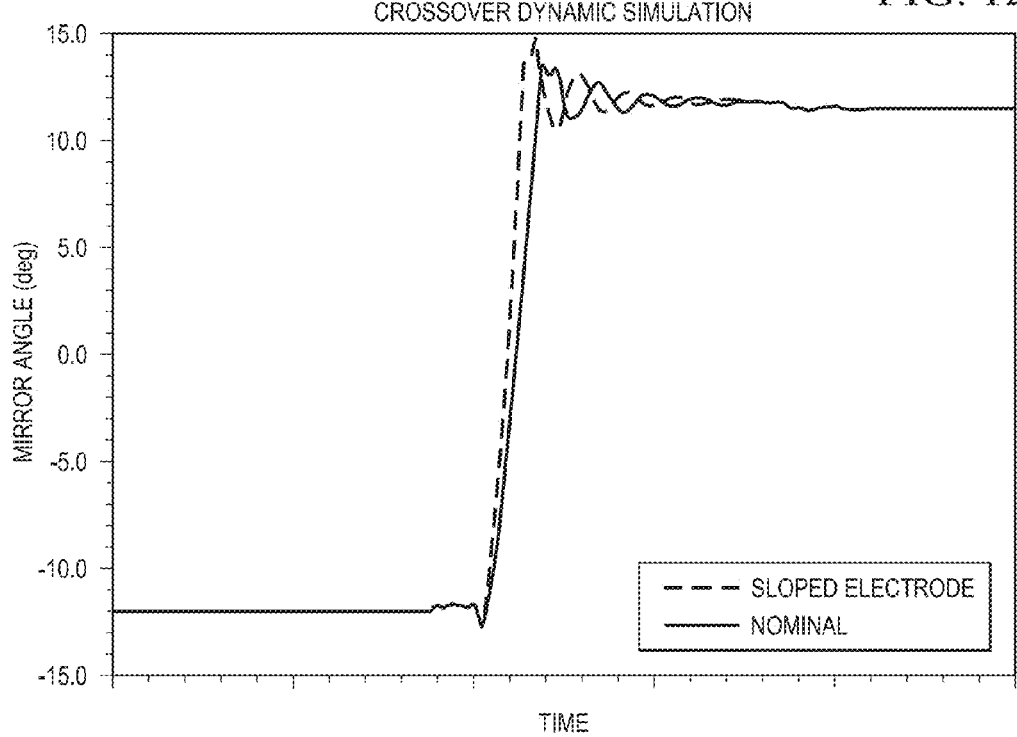
FIG. 12 illustrates the speed of the mirror crossover for the address electrode configurations shown in FIG. 9 and FIG. 10.

FIG. 12 illustrates the speed of the crossover of the mirror 14a for the address electrode configurations shown in FIG. 9 and FIG. 10. Crossover is defined as the mirror 14a crossing from one tilted state to the other tilted state. The sloped electrode 20 provides a faster crossover, where the landed electrostatic moment is increased by a factor of about 2×.

Referring to FIGS. 13-23 there is shown the fabrication process using a sub-wavelength grey-scale lithography masking process according to this disclosure to create the sloped and elevated address electrodes 20. The mirror 14a is formed using a second sacrificial spacer level according to conventional resist patterning processes and will not be described here in detail.

Figure 13:
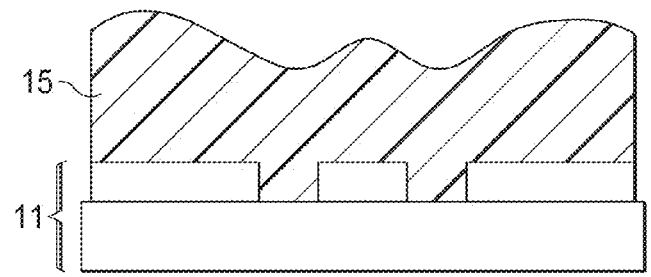
FIGS. 13-22 illustrate an example process according to this disclosure.

FIG. 13 illustrates the sacrificial photoresist deposition of spacer layer 15 upon the substrate 11 including the memory cells (also referred to as a carrier), illustrating the non-planar surface of spacer layer 15 conforming to the non-planar surface of substrate 11.

Figure 14:
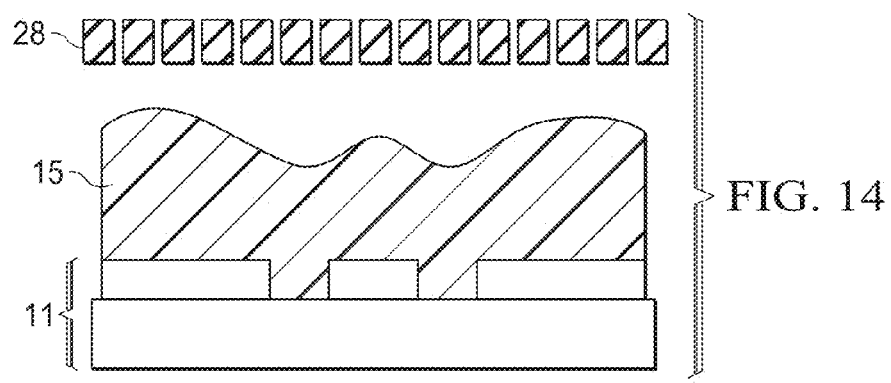

FIG. 14 illustrates exposing the photoresist of spacer layer 15 to a grey-scale mask 28.

Figure 15:
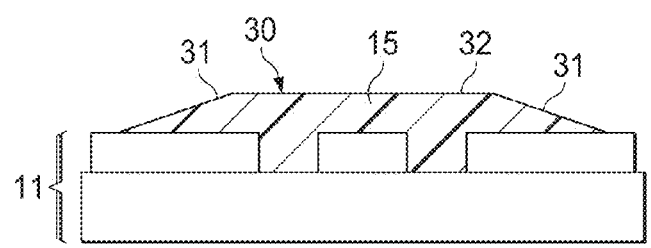

FIG. 15 illustrates developing and etching the exposed photoresist of spacer layer 15 to realize a selectively shaped photoresist upper surface 30 of the spacer layer 15 having a pair of angled upper surfaces 31 each extending downwardly from a flat central portion 32.

Figure 16:
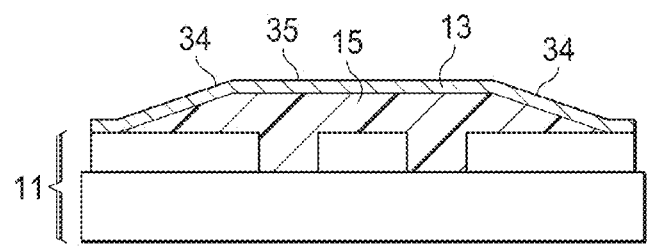

FIG. 16 illustrates a blanket deposition of M2 layer 13 over the spacer layer 15. The M2 layer 13 comprises a metal layer of aluminum or other material as desired. Advantageously, the M2 layer 13 conforms to the shape of the upper surface 30 of spacer layer 15 and thus has a pair of angled surfaces 34 and a flat central portion 35.

Figure 17:
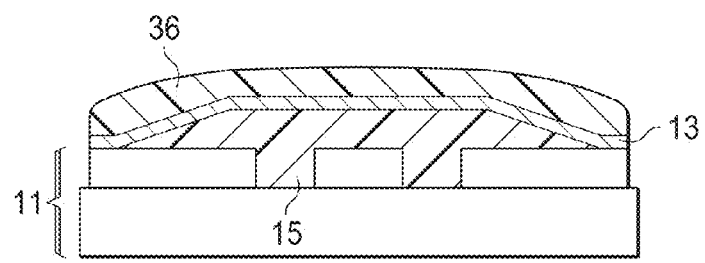

FIG. 17 illustrates the deposition of a pattern photoresist layer 36 upon the M2 layer 13, which is also referred to as a pattern resist level.

Figure 18:
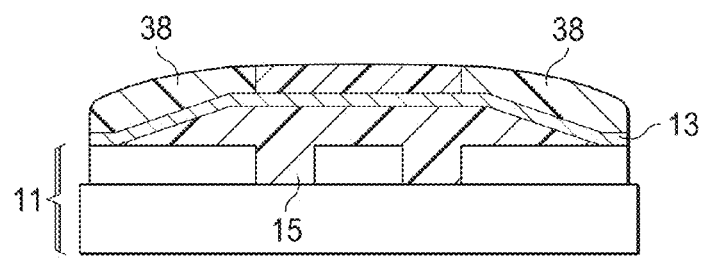

FIG. 18 illustrates exposing the photoresist of layer 36 to define a pattern 38 in the M2 layer 13, the pattern 38 corresponding to shaped electrodes 20 to be created in M2 layer 13.

Figure 19:
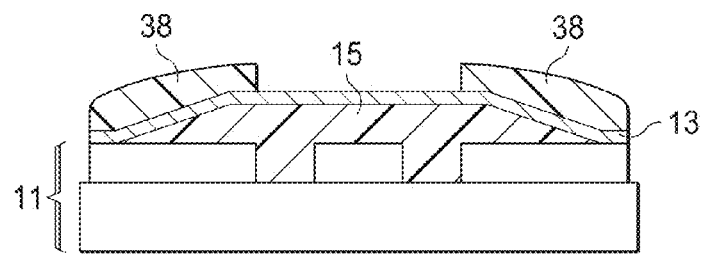

FIG. 19 illustrates developing and stripping the exposed layer 36 to produce the pattern 38.

Figure 20:
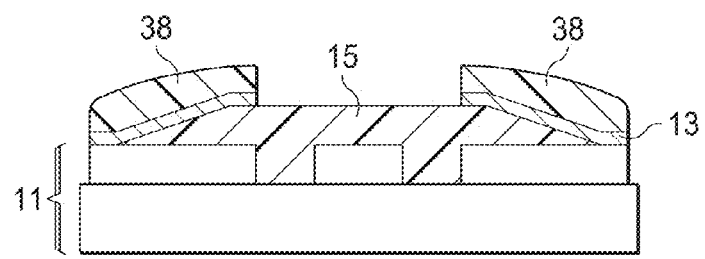

FIG. 20 illustrates etching the M2 layer 13 to define address electrodes 20 in the M2 layer 13 over the spacer layer 15.

Figure 21:
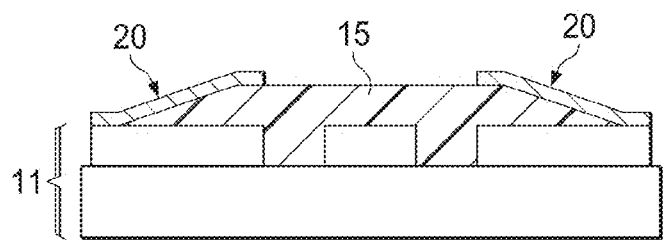

FIG. 21 illustrates removing the pattern resist 38 such that electrodes 20 remain over the spacer layer 15.

Figure 22:
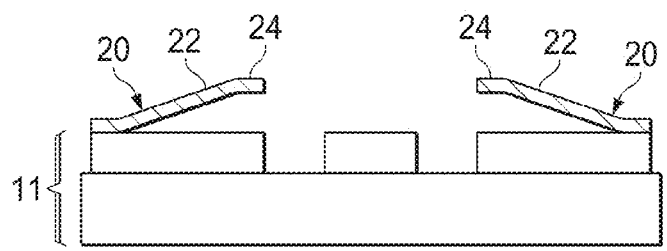

FIG. 22 illustrates removing the sacrificial spacer layer 15, resulting in the electrodes 20 formed from M2 layer 13, each having a sloped portion 22 and a flat portion 24 as shown in FIG. 8 and FIG. 10.

Figure 23:
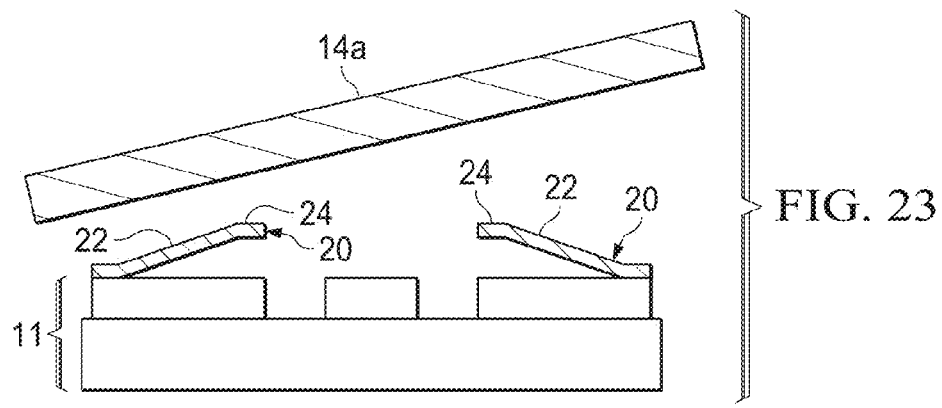
FIG. 23 illustrates the maximized energy density between the mirror and the elevated address electrodes.
Figure 24:
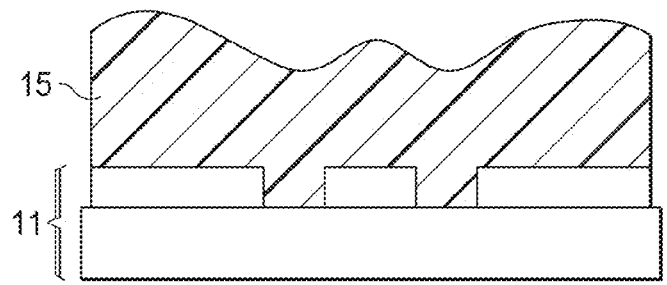
FIGS. 24-34 illustrate another example embodiment whereby a shaped address electrode is formed that is completely angled and without a horizontal portion.

FIG. 23 illustrates the combined angle between the mirror 14a and the sloped portion 22 of address electrode 20 is about 4 degrees. This advantageously improves the electrostatic torque delivery while maintaining a substantially uniform electric field and field gradient.

FIGS. 24-34 illustrate another example embodiment of the disclosure whereby a shaped address electrode 40 is formed that is completely angled and without a horizontal portion, wherein like numerals refer to like elements.

Figure 25:
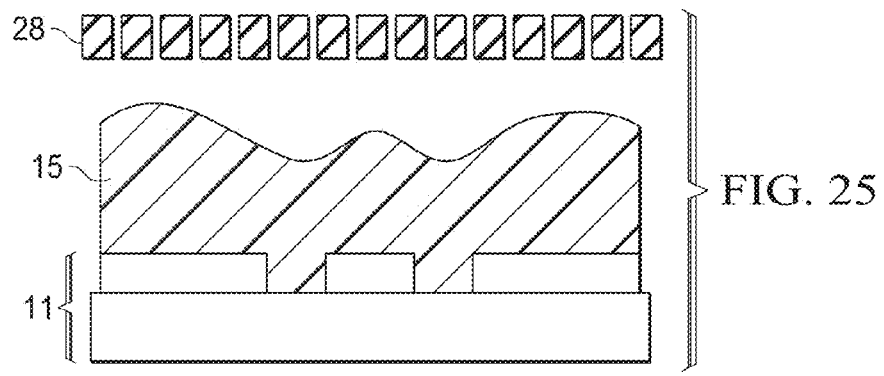
Figure 26:
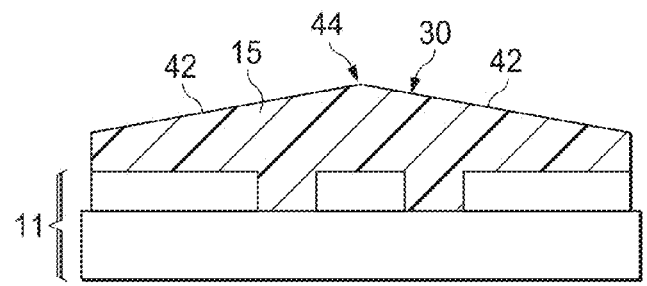

FIGS. 25-26 illustrate shaping the spacer layer 15 using a sub-wavelength grey-scale lithography masking process such that an upper surface 30 of photoresist layer 15 has a pair of angled surfaces 42 extending downwardly from an apex 44.

Figure 27:
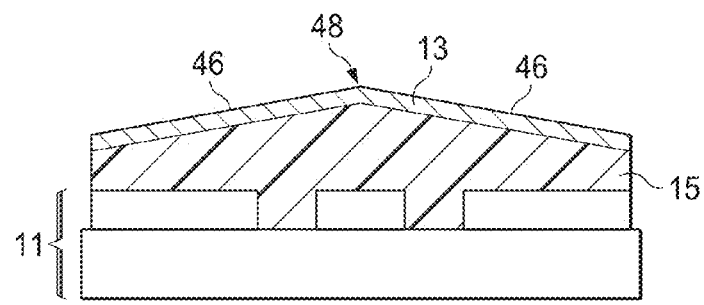

FIG. 27 illustrates a blanket deposition of M2 layer 13 over the spacer layer 15. The M2 layer 13 comprises a metal layer of aluminum or other material as desired. Advantageously, the M2 layer 13 conforms to the shape of the upper surface 30 of spacer layer 15 and thus has a pair of angled surfaces 46 extending from an apex 48.

Figure 28:
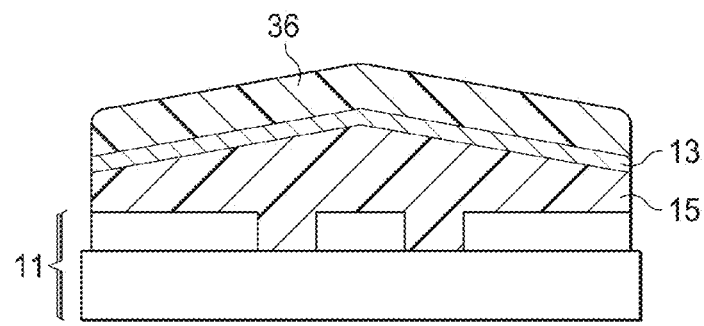

FIG. 28 illustrates the deposition of a pattern photoresist layer 36 upon the M2 layer 13, which is also referred to as a pattern resist level.

Figure 29:
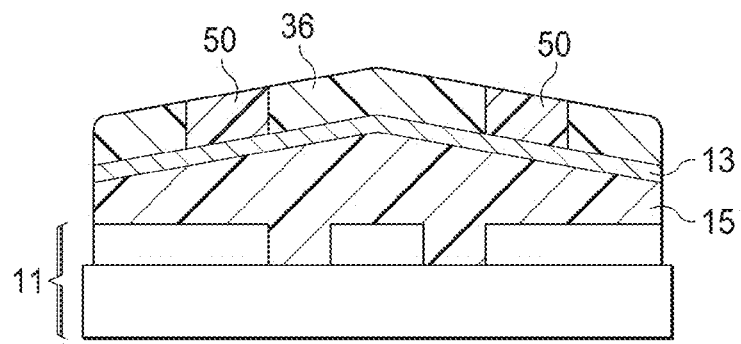

FIG. 29 illustrates exposing the photoresist of layer 36 to define a resist pattern 50 in the M2 layer 13, the resist pattern 50 corresponding to shaped electrodes 40 to be created in M2 layer 13.

Figure 30:
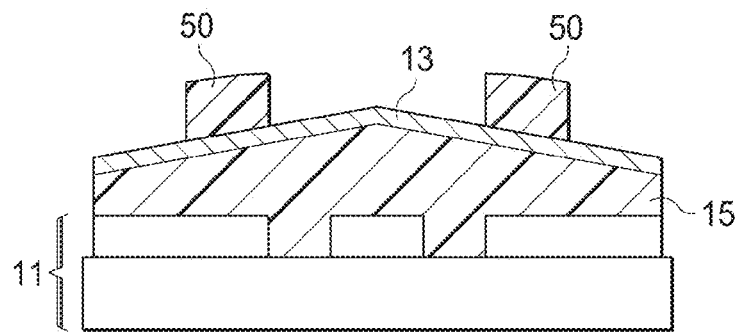

FIG. 30 illustrates developing and stripping the exposed layer 36 to produce the resist pattern 50.

Figure 31:
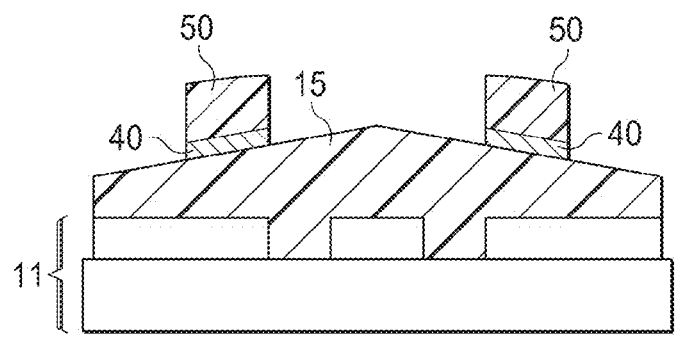

FIG. 31 illustrates etching the M2 layer 13 to define address electrodes 40 in the M2 layer 13 over the spacer layer 15.

Figure 32:
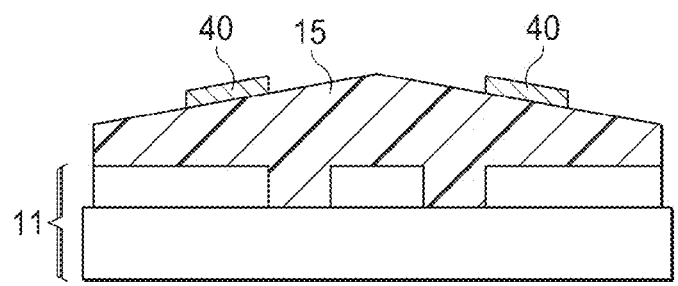

FIG. 32 illustrates removing the resist pattern 50 such that electrodes 40 remain over the spacer layer 15.

Figure 33:
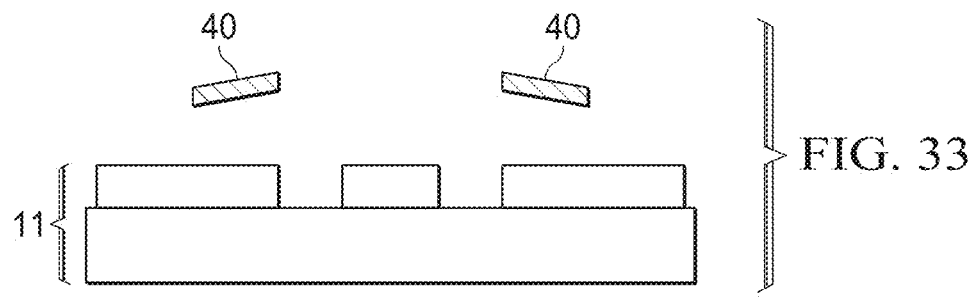

FIG. 33 illustrates removing the sacrificial spacer layer 15, resulting in the electrodes 40 formed from M2 layer 13, each having a sloped portion.

Figure 34:
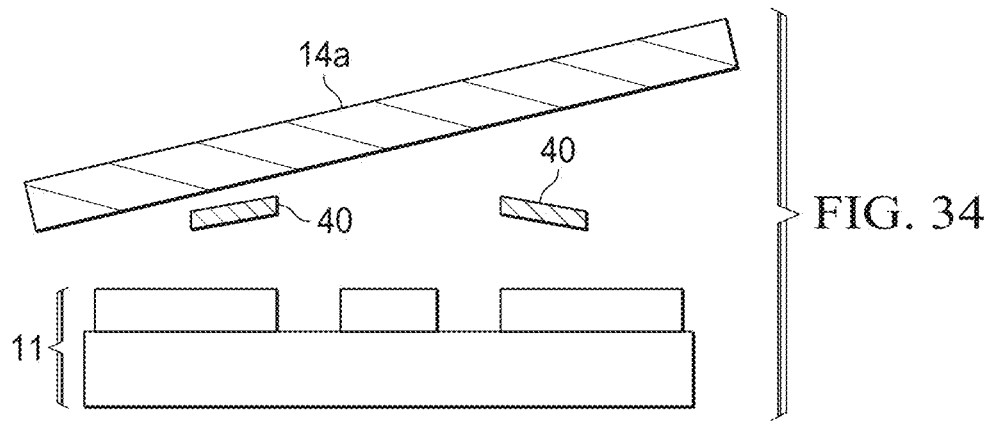

FIG. 34 illustrates the combined angle between the mirror 14a and the sloped portion of address electrode 40 is about 4 degrees. This advantageously improves the electrostatic torque delivery while maintaining a substantially uniform electric field and field gradient.

Figure 35:
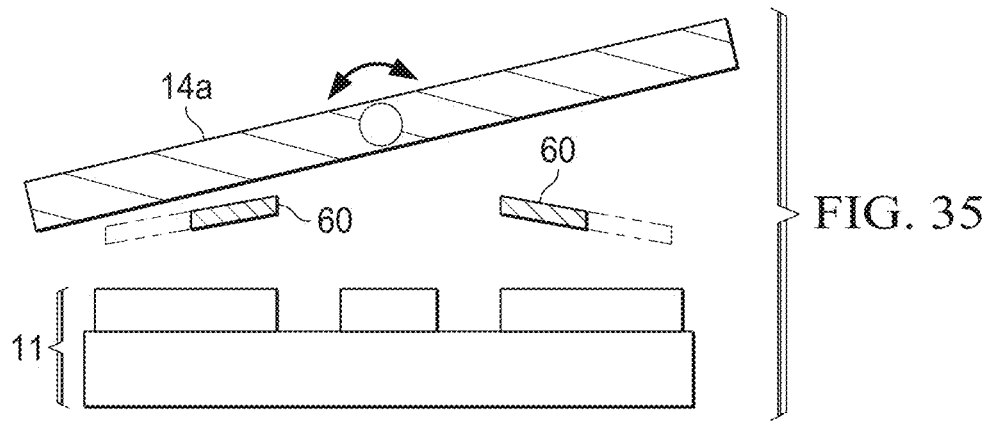
FIG. 35 illustrates another example embodiment of an elevated sloped address electrode that has an extended length providing electrostatic torque gains while maintaining a relatively uniform electric field and field gradient.

FIG. 35 illustrates another example embodiment of an elevated sloped address electrode 60 formed according to the process described and shown in FIGS. 23-34, but wherein the resist pattern 50 in FIG. 32 is extended to form address electrode 60 that is longer than address electrode 40. This extended address electrode 60 provides electrostatic torque gains while maintaining a relatively uniform electric field and field gradient.

Although the figures have illustrated different circuits and operational examples, various changes may be made to the figures. For example, the spacer layer 15 can be exposed by the grey-scale masking to create other shapes in the address electrodes, and also shape other features of the pixel 10.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   depositing a photoresist spacer layer upon an upper surface of a substrate;
   exposing the photoresist spacer layer to a grey-scale lithographic mask to shape an upper surface of the photoresist spacer layer;
   forming a control member without a horizontal portion upon the shaped upper surface such that the control member has: an upper surface of which at least a portion is non-parallel to the substrate; and a lower surface of which at least a portion is non-parallel to the substrate; and
   forming a positionable image member over the control member, the image member configured to be positioned as a function of an electrostatic field distributed by the control member to form a spatial light modulator (SLM).

2. The method as specified in claim 1, wherein the upper surface of the photoresist spacer layer is sloped with respect to the substrate by the grey-scale lithographic mask.

3. The method as specified in claim 2, further comprising masking a selected portion of the photoresist spacer layer.

4. The method as specified in claim 1, wherein the control member comprises an address electrode having a sloped portion with respect to the substrate.

5. The method as specified in claim 4, wherein the image member is substantially parallel to the address electrode when the image member is tilted over and towards the address electrode.

6. The method as specified in claim 5, wherein the address electrode is configured to establish a substantially uniform field or energy density between the address electrode and the image member.

7. The method as specified in claim 1, wherein the substrate includes memory configured to control a position of the image member.

8. The method as specified in claim 1, wherein the image member has a light reflective upper surface configured to modulate incident light and form an image.

9. The method as specified in claim 1, wherein the image member is formed on a torsion hinge.

10. The method as specified in claim 1, wherein the control member is elevated above the substrate and positioned below the image member.

11. A method comprising:
    depositing a spacer layer upon an upper surface of a substrate;
    forming an address electrode without a horizontal portion using a grey-scale lithographic mask to shape an upper surface of the spacer layer, the address electrode having: an upper surface of which at least a portion is sloped with respect to the substrate; and a lower surface of which at least a portion is sloped with respect to the substrate; and
    forming a positionable image member over the substrate, the image member configured to be positioned as a function of an electrostatic field distributed by the address electrode.

12. The method as specified in claim 11, wherein the image member forms a spatial light modulator (SLM).

13. The method as specified in claim 11, further comprising forming the address electrode to be elevated above the substrate and positioned below the image member.

14. The method as specified in claim 11, wherein the image member is substantially parallel to the address electrode when tilted.

15. The method as specified in claim 14, wherein the address electrode is configured to establish a substantially uniform field or energy density between the address electrode and the image member.

16. A method comprising:
    depositing a photoresist spacer layer upon an upper surface of a substrate including memory;
    exposing the photoresist spacer layer to a grey-scale lithographic mask to shape an upper surface of the photoresist spacer layer;
    forming a control member without a horizontal portion upon the shaped upper surface, the control member having: an upper surface of which at least a portion is sloped with respect to the substrate; and a lower surface of which at least a portion is sloped with respect to the substrate; and
    forming a positionable image member over the control member, wherein the image member is substantially parallel to the control member when tilted as a function of an electrostatic field distributed by the control member as a function of the memory to form a spatial light modulator (SLM).

17. The method as specified in claim 16, wherein the image member has a light reflective upper surface configured to modulate incident light and form an image.

18. The method as specified in claim 16, wherein the image member is formed on a torsion hinge.

* * * * *